US010937862B2

(12) United States Patent
Reznicek et al.

(10) Patent No.: US 10,937,862 B2
(45) Date of Patent: Mar. 2, 2021

(54) NANOSHEET SUBSTRATE ISOLATED SOURCE/DRAIN EPITAXY VIA AIRGAP

(71) Applicant: International Business Machines Corporation, Armonk, NY (US)

(72) Inventors: Alexander Reznicek, Troy, NY (US); Choonghyun Lee, Rensselaer, NY (US); Xin Miao, Guilderland, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/050,735

(22) Filed: Jul. 31, 2018

(65) Prior Publication Data

US 2020/0044023 A1    Feb. 6, 2020

(51) Int. Cl.
*H01L 29/06*       (2006.01)
*H01L 21/762*      (2006.01)
(Continued)

(52) U.S. Cl.
CPC .... *H01L 29/0673* (2013.01); *H01L 21/76289* (2013.01); *H01L 21/823814* (2013.01); *H01L 21/823864* (2013.01); *H01L 23/5329* (2013.01); *H01L 29/0847* (2013.01); *H01L 29/66545* (2013.01); *H01L 21/764* (2013.01); *H01L 29/42392* (2013.01)

(58) Field of Classification Search
CPC ............. H01L 29/0673; H01L 29/0847; H01L 21/76289; H01L 21/823814;
(Continued)

(56) References Cited

U.S. PATENT DOCUMENTS 9,362,355 B1    6/2016 Cheng et al.
9,620,590 B1    4/2017 Bergendahl et al.
(Continued)

OTHER PUBLICATIONS

Zhang, Q., et al., "Novel GAA Si Nanowire p-MOSFETs with Excellent Short Channel Effect Immunity via an Advanced Forming Process," IEEE Electron Device Letters, Apr. 2018, pp. 464-467, vol. 39, No. 4.

(Continued)

*Primary Examiner* — Patricia D Reddington
(74) *Attorney, Agent, or Firm* — Scully, Scott, Murphy & Presser, P.C.; L. Jeffrey Kelly, Esq.

(57) ABSTRACT

Parasitic transistor formation under a semiconductor containing nanosheet device is eliminated by forming an airgap between the source/drain regions of the semiconductor containing nanosheet device and the semiconductor substrate. The airgap is created by forming a sacrificial germanium-containing semiconductor material at the bottom of the source/drain regions prior to the epitaxial growth of the source/drain regions from physically exposed sidewalls of each semiconductor channel material nanosheet of a nanosheet material stack. After inner dielectric spacer formation, the sacrificial germanium-containing semiconductor material can be reflown to seal any possible openings to the semiconductor substrate. The source/drain regions are then epitaxially grown and thereafter, the sacrificial germanium-containing semiconductor material is removed from the structure creating the airgap between the source/drain regions of the semiconductor containing nanosheet device and the semiconductor substrate.

11 Claims, 13 Drawing Sheets

(51) Int. Cl.
*H01L 21/8238* (2006.01)
*H01L 29/08* (2006.01)
*H01L 23/532* (2006.01)
*H01L 29/66* (2006.01)
*H01L 29/423* (2006.01)
*H01L 21/764* (2006.01)

(58) Field of Classification Search
CPC ......... H01L 21/823864; H01L 23/5329; H01L 29/66545; H01L 29/42392; H01L 21/764
See application file for complete search history.

(56) References Cited

U.S. PATENT DOCUMENTS

| | | |
|---|---|---|
| 9,716,158 B1 | 7/2017 | Cheng et al. |
| 9,905,643 B1 | 2/2018 | Bergendahl et al. |
| 2014/0327054 A1* | 11/2014 | Adam ................. H01L 29/6656 257/288 |
| 2015/0333167 A1 | 11/2015 | Leobandung |
| 2017/0133459 A1 | 5/2017 | Pranatharthiharan et al. |
| 2017/0309719 A1 | 10/2017 | Sun et al. |
| 2017/0365604 A1* | 12/2017 | Suh ..................... H01L 27/0924 |
| 2018/0090586 A1 | 3/2018 | Cheng et al. |
| 2018/0301564 A1* | 10/2018 | Kwon .................... B82Y 10/00 |

OTHER PUBLICATIONS

Loubet, N., et al.,"Stacked nanosheet gate-all-around transistor to enable scaling beyond FinFET," Symposium on VLSI Technology, Date of Conference: Jun. 5-8, 2017, pp. T230-T231.

* cited by examiner

NANOSHEET SUBSTRATE ISOLATED SOURCE/DRAIN EPITAXY VIA AIRGAP

BACKGROUND

The present application relates to a semiconductor structure and a method of forming the same. More particularly, the present application relates to a semiconductor structure containing at least one stacked semiconductor material nanosheet device that is devoid of a parasitic transistor beneath the at least one stacked semiconductor nanosheet device. The present application also relates to a method of forming such a semiconductor structure.

The use of non-planar semiconductor devices such as, for example, a nano sheet containing device is the next step in the evolution of complementary metal oxide semiconductor (CMOS) devices. By "nanosheet containing device" it is meant that the device contains one or more layers of semiconductor channel material portions having a vertical thickness that is substantially less than its width.

Nanosheet formation relies on the selective removal of one semiconductor material (e.g., silicon) to another semiconductor material (e.g., a silicon germanium alloy) to form suspended nanosheets for gate-all-around devices. In the prior art, source/drain (S/D) regions for nanosheet containing devices are formed by epitaxial growth of a semiconductor material upwards from an exposed surface of the semiconductor substrate and from sidewalls of each nanosheet. Such a bottom up epitaxial growth of the S/D regions from the semiconductor substrate creates an undesirable parasitic transistor under the nanosheet stack. There is a need for providing nanosheet containing devices that avoid such a bottom up epitaxial growth of the S/D regions.

SUMMARY

Parasitic transistor formation under a semiconductor containing nanosheet device is eliminated by forming an airgap between the source/drain regions of the semiconductor containing nanosheet device and the semiconductor substrate. The airgap is created by forming a sacrificial germanium-containing semiconductor material at the bottom of the source/drain regions prior to the epitaxial growth of the source/drain regions from physically exposed sidewalls of each semiconductor channel material nanosheet of a nanosheet material stack. After inner dielectric spacer formation, the sacrificial germanium-containing semiconductor material can be reflown to seal any possible openings to the semiconductor substrate. The source/drain regions are then epitaxially grown and thereafter, the sacrificial germanium-containing semiconductor material is removed from the structure creating the airgap between the source/drain regions of the semiconductor containing nanosheet device and the semiconductor substrate.

One aspect of the present application relates to a semiconductor containing nanosheet device (i.e., semiconductor structure) that is devoid of any parasitic transistor. In one embodiment, the semiconductor structure includes a plurality of stacked and suspended semiconductor channel material nanosheets located above a semiconductor substrate. A functional gate structure surrounds a portion of each semiconductor channel material nanosheet of the plurality of stacked and suspended semiconductor channel material nanosheets. A source/drain (S/D) region is present on each side of the functional gate structure and physically contacting sidewalls of each semiconductor channel material nanosheet of the plurality of stacked and suspended semiconductor channel material nanosheets, and an airgap is located between the source/drain (S/D) region and the semiconductor substrate.

Another aspect of the present application relates to a method of forming a semiconductor containing nanosheet device that is devoid of any parasitic transistor. In one embodiment, the method includes providing a nanosheet stack of alternating nanosheets of a sacrificial semiconductor material nanosheet and a semiconductor channel material nanosheet located on a surface of a semiconductor substrate, wherein a sacrificial gate structure and a dielectric spacer material layer straddle over the nanosheet stack, and wherein a recessed surface of the semiconductor substrate located on each side of the nanosheet stack is physically exposed. End portions of each of the sacrificial semiconductor material nanosheets are then recessed to provide a gap between each of the semiconductor channel material nanosheets. An additional dielectric spacer material layer is formed on the dielectric spacer material layer, within each gap and on the physically exposed surfaces of the semiconductor substrate. Next, the additional dielectric spacer material layer is removed from the recessed surface of the semiconductor substrate, and thereafter a sacrificial germanium-containing semiconductor material is formed on the recessed surface of the semiconductor substrate. Inner gate spacers are then formed in the gaps by removing a portion of the additional dielectric spacer material layer. Next, a source/drain (S/D) region is formed on physically exposed sidewalls of each semiconductor channel material nanosheet. After S/D region formation, the sacrificial germanium-containing material is removed to provide an airgap between each S/D region and the recessed surface of the semiconductor substrate.

DETAILED DESCRIPTION

Figure 1:
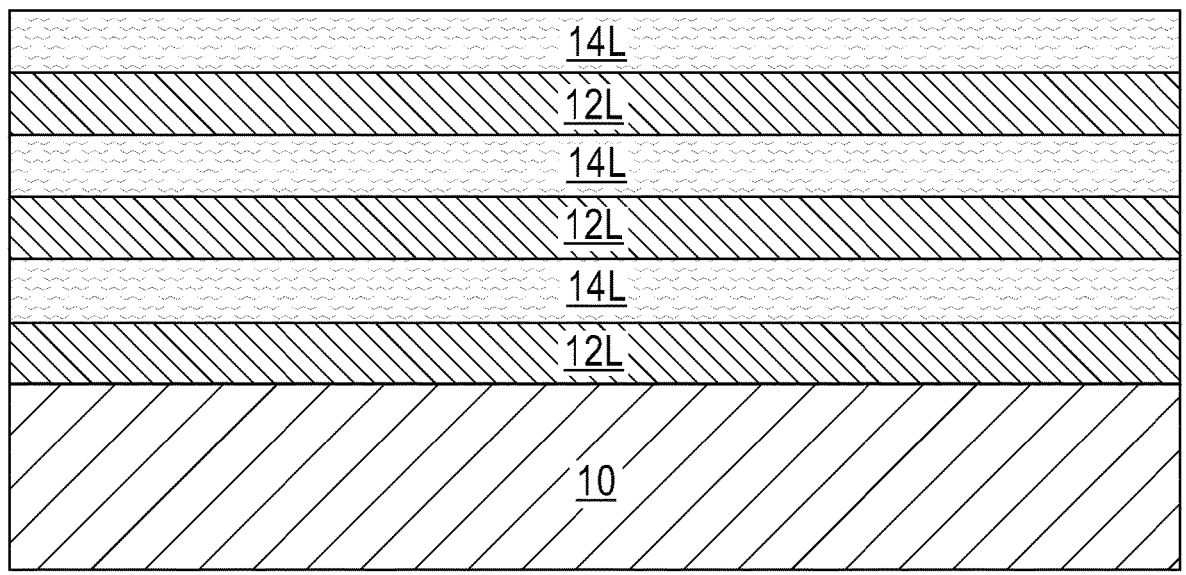
FIG. 1 is a cross sectional view of an exemplary semiconductor structure including a semiconductor material stack structure of alternating layers of a sacrificial semiconductor material and a semiconductor channel material on a surface of a semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure at an early stage of fabrication and in accordance with an embodiment of the present application. The exemplary semiconductor structure of FIG. 1 includes a semiconductor material stack structure of alternating layers of a sacrificial semiconductor material 12L and a semiconductor channel material 14L on a surface of a semiconductor substrate 10. A trench isolation structure such as, for example, a shallow trench isolation structure (not shown), may be located around the active area of the semiconductor substrate 10 including the semiconductor material stack structure shown in FIG. 1.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator (SOI) substrate. A SOI substrate typically includes a handle substrate, an insulator layer and a topmost semiconductor material layer. In some embodiments, the handle substrate of the SOI substrate may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

Semiconductor material stack structure (12L, 14L) is then formed upon the semiconductor substrate 10. As mentioned above, semiconductor material stack structure (12L, 14L) includes alternating layers of a sacrificial semiconductor material 12L and a semiconductor channel material 14L. In FIG. 1 and by way of one example, semiconductor material stack structure (12L, 14L) includes three layers of sacrificial semiconductor material 12L and three layers of semiconductor channel material. The semiconductor material stack structure that can be employed in the present application is not limited to the specific embodiment illustrated in FIG. 1. Instead, the semiconductor material stack structure can include any number of layers of sacrificial semiconductor material 12L and corresponding layers of semiconductor channel material 14L.

Each layer of sacrificial semiconductor material 12L is composed of a first semiconductor material which differs in composition from at least an upper portion of the semiconductor substrate 10. In one embodiment, the upper portion of the semiconductor substrate 10 is composed of silicon, while each layer of sacrificial semiconductor material 12L is composed of a silicon germanium alloy. The first semiconductor material that provides each layer of sacrificial semiconductor material 12L can be formed utilizing an epitaxial growth (or deposition process) as defined in greater detail herein below.

Each layer of semiconductor channel material 14L is composed of a second semiconductor material that has a different etch rate than the first semiconductor material that provides the first layers of sacrificial semiconductor material 12L. The second semiconductor material that provides each layer of semiconductor channel material 14L may be the same as, or different from, the semiconductor material that provides at least the upper portion of the semiconductor substrate 10. In one example, at least the upper portion of the semiconductor substrate 10 and each layer of semiconductor channel material 14L is composed of Si or a III-V compound semiconductor, while each layer of sacrificial semiconductor material 12L is composed of a silicon germanium alloy. The second semiconductor material that provides each layer of semiconductor channel material 14L can be formed utilizing an epitaxial growth (or deposition process) as defined in greater detail herein below.

Semiconductor material stack structure (12L, 14L) can be formed by sequential epitaxial growth of alternating layers of the first semiconductor material and the second semiconductor material. Following epitaxial growth of the topmost layer of the semiconductor material stack structure (12L, 14L) a patterning process may be used to provide the semiconductor material stack structure (12L, 14L) shown in FIG. 1. Patterning may be performed by lithography and etching or any other patterning method known to those skilled in the art including, for example, a sidewall-image transfer (SIT) process.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the first and second semiconductor materials that provide the layers of sacrificial semiconductor material 12L and the layers of semiconductor channel material 14L, respectively, can be performed utilizing any well known precursor gas or gas mixture. Carrier gases like hydrogen, nitrogen, helium and argon can be used.

The term "semiconductor material stack structure" denotes a continuous structure including a pair of vertical sidewalls that are parallel to each other. As used herein, a surface is "vertical" if there exists a vertical plane from which the surface does not deviate by more than three times the root mean square roughness of the surface. Each layer of sacrificial semiconductor material 12L may have a thickness from 5 nm to 12 nm, while each layer of semiconductor channel material 14L may have a thickness from 6 nm to 12 nm. Each layer of sacrificial semiconductor material 12L may have a thickness that is the same as, or different from, a thickness of each layer of semiconductor channel material 14L.

Figure 2:
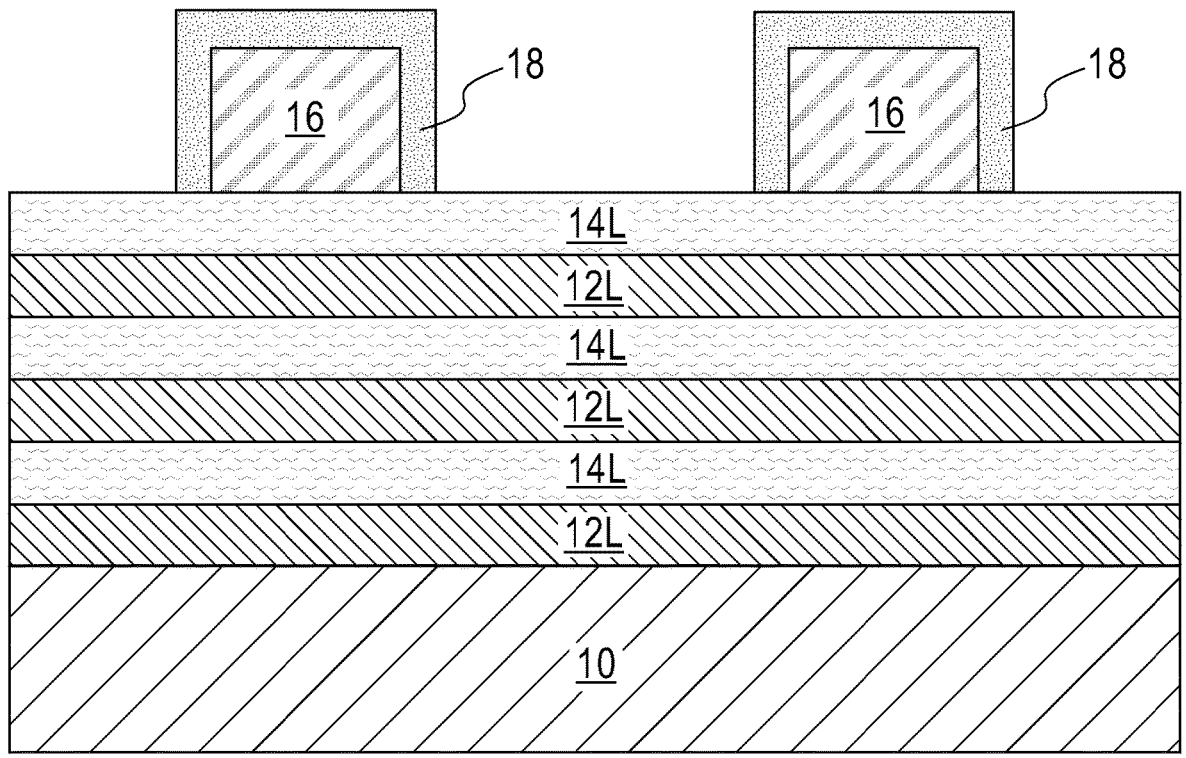
FIG. 2 is a cross sectional view of the exemplary semiconductor structure of FIG. 1 after forming at least one sacrificial gate structure and a dielectric spacer material layer.

Referring now to FIG. 2, there is illustrated the exemplary semiconductor structure of FIG. 1 after forming at least one sacrificial gate structure 16 and a dielectric spacer material layer 18. By way of illustration, two sacrificial gate structures 16 are exemplified in the drawings of the present application. Each sacrificial gate structure 16 is located on a first side and a second side of the semiconductor material stack structure (12L, 14L) and spans across a topmost surface of a portion of the semiconductor material stack structure (12L, 14L). Each sacrificial gate structure 16 thus straddles over a portion of the semiconductor material stack (12L, 14L). The dielectric spacer material layer 18 is present on sidewalls and a topmost surface of each sacrificial gate structure 16; the dielectric spacer material layer 18 thus also straddles over the semiconductor material stack (12L, 14L).

It is noted that in the drawings, the sacrificial gate structures 16 and dielectric spacer material layer 18 are only shown as being present atop, not along sidewalls, of the semiconductor material stack structure (12L, 14L). This was done for clarity and to illustrate the nanosheet stack that will be subsequently formed beneath the sacrificial gate structures 16 and the dielectric spacer material layer 18.

Each sacrificial gate structure 16 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure 16. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 16, the dielectric spacer material layer 18 can be formed on exposed surfaces of each sacrificial gate structure 16. The dielectric spacer material layer 18 can be formed by first providing a dielectric spacer material and then etching the dielectric spacer material. One example of a dielectric spacer material that may be employed in the present application is silicon nitride. The dielectric spacer material that provides the dielectric spacer material layer 18 may be provided by a deposition process including, for example, chemical vapor deposition (CVD), plasma enhanced chemical vapor deposition (PECVD), or physical vapor deposition (PVD). The etch used to provide the dielectric spacer material layer 18 may comprise a dry etching process such as, for example, reactive ion etching.

Figure 3:
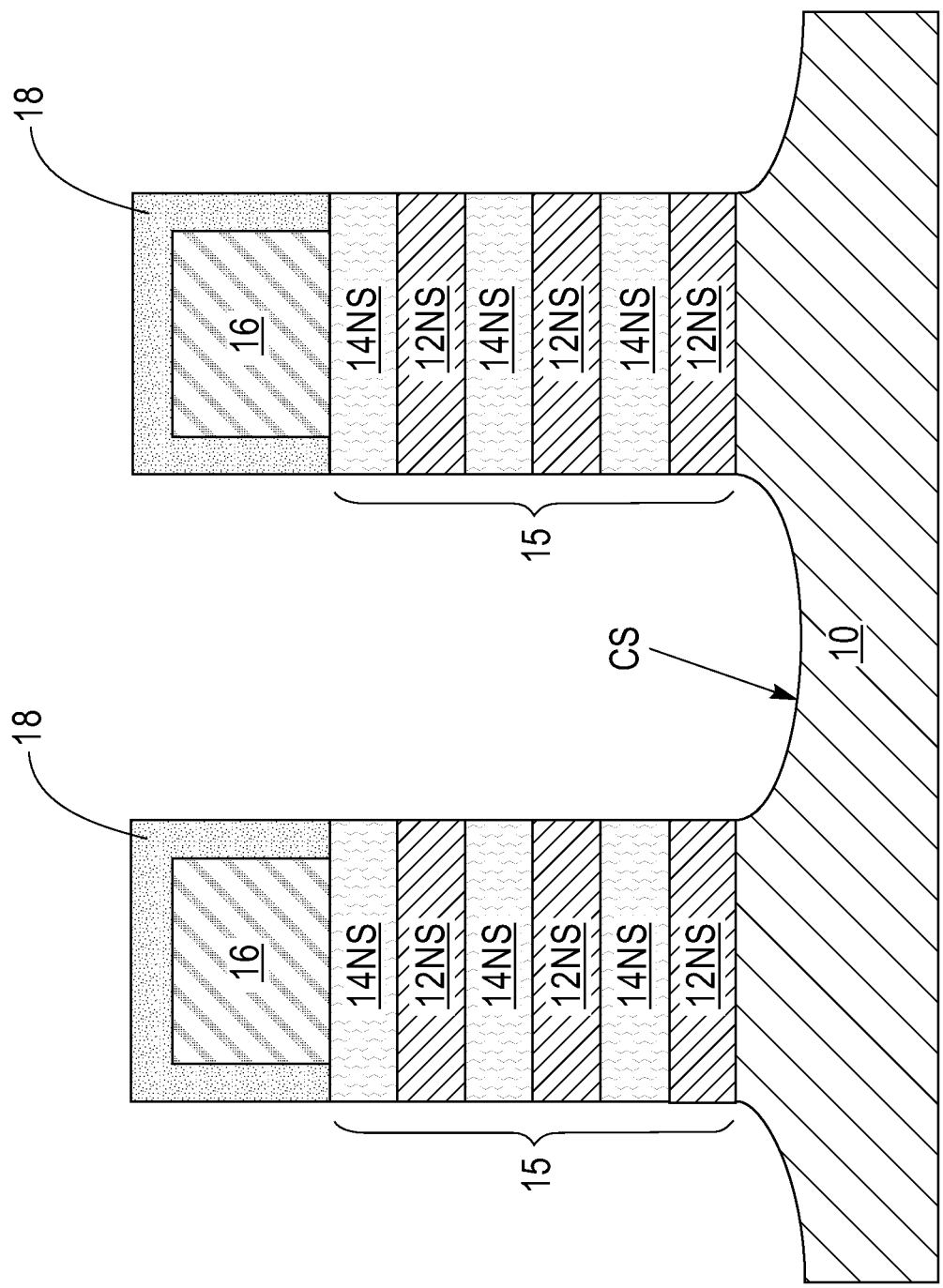
FIG. 3 is a cross sectional view of the exemplary semiconductor structure of FIG. 2 after forming a nanosheet stack of alternating nanosheets of a sacrificial semiconductor material and a semiconductor channel material under the least one sacrificial gate structure and the dielectric spacer material layer by removing physically exposed portions of the semiconductor material stack structure that are not protected by the least one sacrificial gate structure and the dielectric spacer material layer.

Referring now to FIG. 3, there is illustrated the exemplary semiconductor structure of FIG. 2 after forming a nanosheet stack 15 of alternating nanosheets of a sacrificial semiconductor material 12NS and a semiconductor channel material 14NS that are under the least one sacrificial gate structure 16 and the dielectric spacer material layer 18. The nanosheet stack 15 is formed by removing physically exposed portions of the semiconductor stack structure (12L, 14L) that are not protected by the least one sacrificial gate structure 16 and the dielectric spacer material layer 18. During this step of the present application, a portion of the semiconductor substrate 10 may also be removed, i.e., recessed, to provide a recessed surface. In such an embodiment, the recessed surface of the semiconductor substrate 10 may be a concave surface, CS.

The removal of the portions of the semiconductor material stack (12L, 14L) not covered by the least one sacrificial gate structure 16 and the dielectric spacer material layer 18 can be performed utilizing an anisotropic etching process such as, for example, reactive ion etching (RIE). Portions of the semiconductor material stack (12L, 14L) remain beneath the least one sacrificial gate structure 16 and the dielectric spacer material layer 18. The remaining portion of the semiconductor material stack that is presented beneath the least one sacrificial gate structure 16 and the dielectric spacer material layer 18 is referred to as nanosheet stack 15.

Nanosheet stack 15 includes alternating nanosheets of remaining portions of each layer of sacrificial semiconductor material (referred to herein as a sacrificial semiconductor material nanosheet 12NS) and remaining portions of each layer of semiconductor channel material (referred to herein as a semiconductor channel material nanosheet 14NS).

Each nanosheet, i.e., sacrificial semiconductor material nanosheet 12NS and semiconductor channel material nanosheet 14NS, that constitutes the nanosheet stack 15 has a thickness as mentioned above for the layers of sacrificial semiconductor material 12L and semiconductor channel material 14L, and a width from 30 nm to 200 nm. At this point of the present application and as illustrated in FIG. 3, the sidewalls of each sacrificial semiconductor material nanosheet 12NS are vertically aligned to sidewalls of each semiconductor channel material nanosheet 14NS, and the vertically aligned sidewalls of the nanosheet stack 15 are vertically aligned to an outmost sidewall of the dielectric spacer material layer 18.

Figure 4:
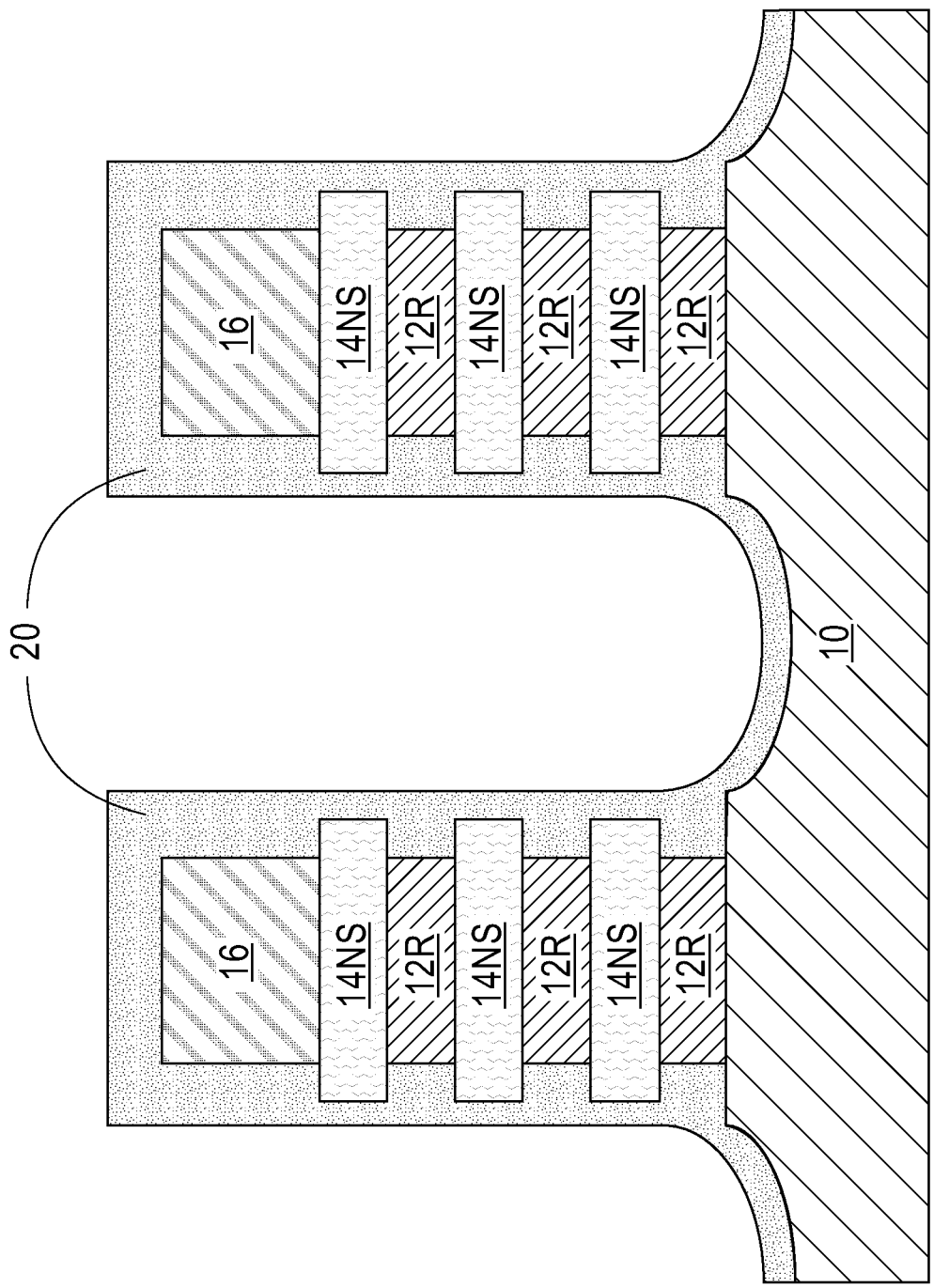
FIG. 4 is a cross sectional view of the exemplary semiconductor structure of FIG. 3 after recessing each sacrificial semiconductor material nanosheet and forming additional dielectric spacer material; the dielectric spacer material layer and the additional dielectric spacer material are referred to as a dielectric gate spacer material layer.

Referring now to FIG. 4, there is illustrated the exemplary semiconductor structure of FIG. 3 after recessing each sacrificial semiconductor material nanosheet 12NS and forming additional dielectric spacer material. Each recessed sacrificial semiconductor material nanosheet is designated as element 12R in the drawings of the present application. Each recessed sacrificial semiconductor material nanosheet 12R has a width that is less than the original width of each sacrificial semiconductor material nanosheet 12NS. The recessing of each sacrificial semiconductor material nanosheet 12NS provides a gap (not specifically shown) between each neighboring pair of semiconductor channel material nanosheets 14NS within a given nanosheet stack 15; a gap is also formed between the bottommost semiconductor channel material nanosheet 14NS and the semiconductor substrate 10. The recessing of each sacrificial semiconductor material nanosheet 12NS may be performed utilizing a lateral etching process that is selective in removing physically exposed end portions of each sacrificial semiconductor material nanosheet 12NS relative to each semiconductor channel material nanosheet 14NS.

The additional dielectric spacer material that is added is compositionally the same as the dielectric spacer material layer 18 mentioned above. In one example, the additional dielectric spacer material and the dielectric spacer material layer 18 are both composed of silicon nitride. For clarity, the additional dielectric spacer material and the dielectric spacer material layer 18 can now be referred to as dielectric gate spacer material layer 20. It is noted that the additional dielectric spacer material forms on the physically exposed surfaces of the dielectric spacer material layer 18, within each gap created by the recessing of each sacrificial semiconductor material nanosheet 12NS, and on the recessed surface of the semiconductor substrate 10. The additional dielectric spacer material can be formed utilizing one of the deposition processes mentioned above in forming the dielectric spacer material layer 18.

Figure 5:
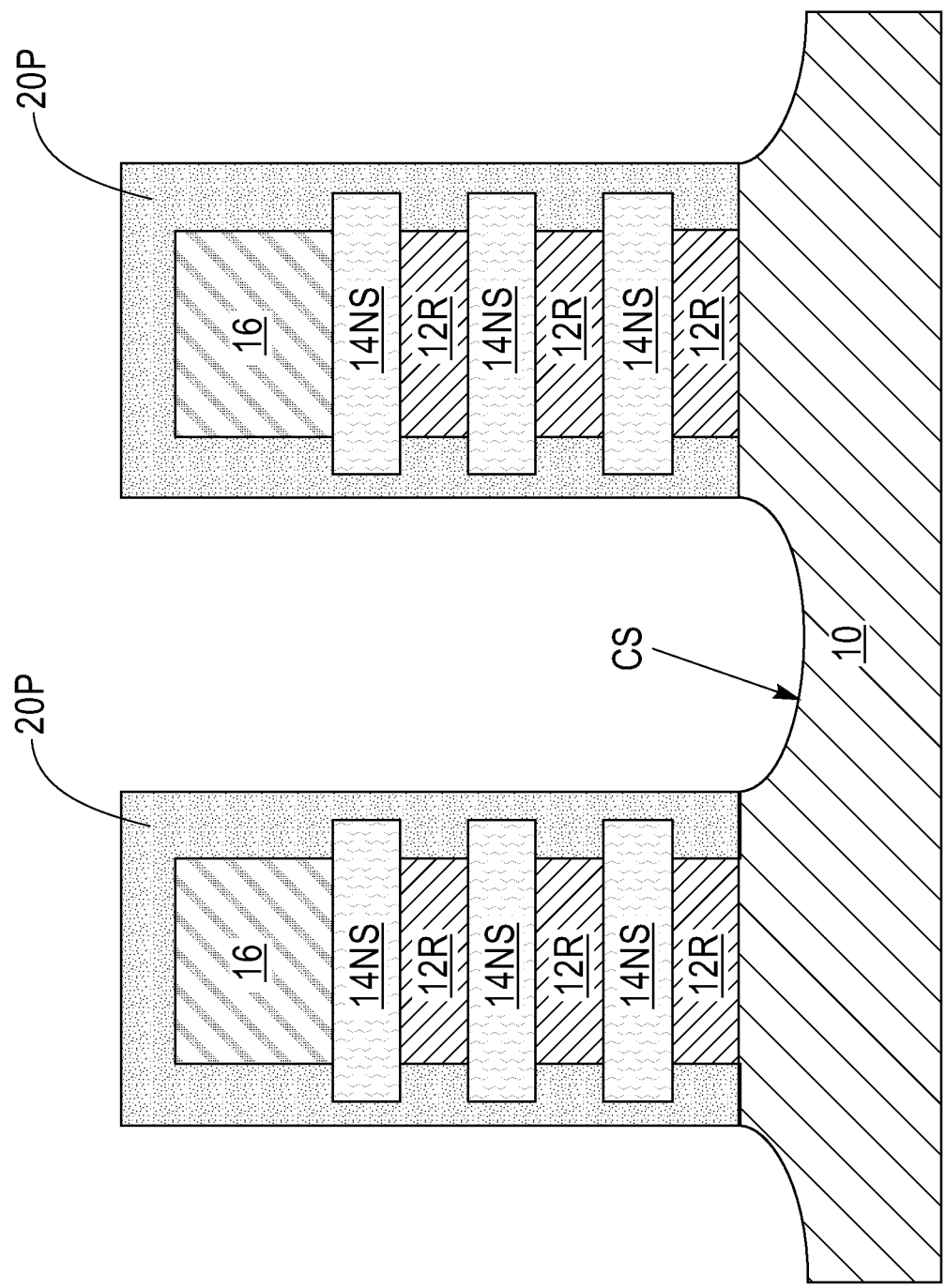
FIG. 5 is a cross sectional view of the exemplary semiconductor structure of FIG. 4 after removing the dielectric gate spacer material layer from a recessed surface of the semiconductor substrate.

Referring now to FIG. 5, there is shown the exemplary semiconductor structure of FIG. 4 after removing the dielectric gate spacer material layer 20 from the recessed surface of the semiconductor substrate 10; the remaining dielectric gate spacer material layer 20 may be referred to herein as a dielectric gate spacer material portion 20P. The dielectric gate spacer material layer 20 may be removed from the recessed surface of the semiconductor substrate 10 utilizing a directional etching process. In one example, gas cluster ion beam etching may be used to remove the dielectric gate spacer material layer 20 from the recessed surface of the semiconductor substrate 10. The removal of the dielectric gate spacer material layer 20 from the recessed surface of the semiconductor substrate 10 re-exposes the recessed surface of the semiconductor substrate 10. In the illustrated embodiment of FIG. 5, the concave surface, CS, is re-exposed.

Figure 6:
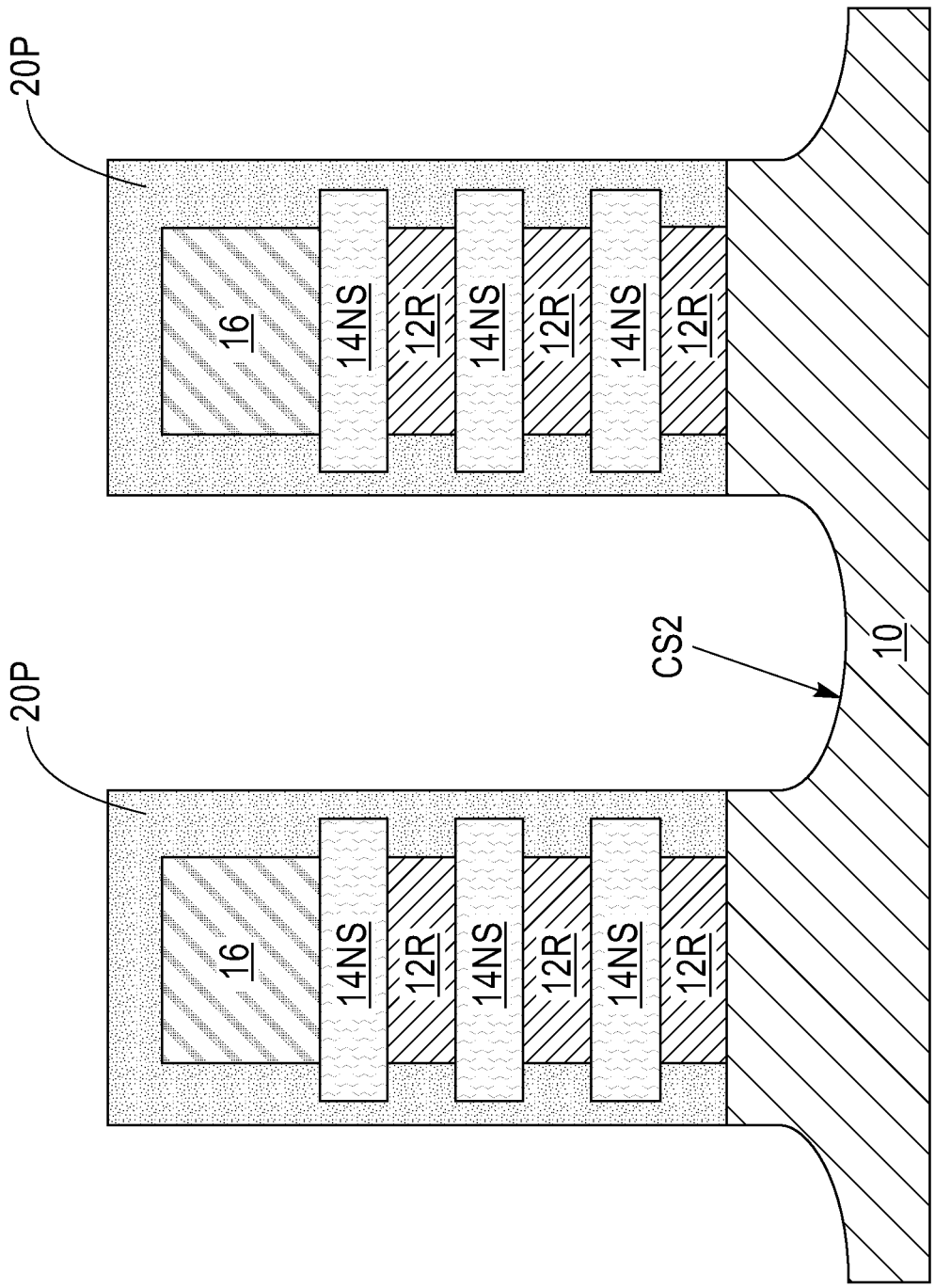
FIG. 6 is a cross sectional view of the exemplary semiconductor structure of FIG. 5 after performing an optional second recessing of the semiconductor substrate.

Referring now to FIG. 6, there is illustrated the exemplary semiconductor structure of FIG. 5 after performing an optional second recessing of the semiconductor substrate 10; the second recessing can provide increased area for forming the counter doped semiconductor layer. In some embodiments, this step is optional. The optional second recess may provide semiconductor substrate 10 with another concave surface, CS2.

The optional second recessing may be performed utilizing an etching process such as, for example, reactive ion etching (RIE). No etching/recessing of the recessed sacrificial semiconductor material nanosheets 12R and the semiconductor channel material nanosheets 14NS within a given nanosheet stack 15 is observed since the same are protected by the sacrificial gate structure 16 and the dielectric gate spacer material portion 20P.

Figure 7:
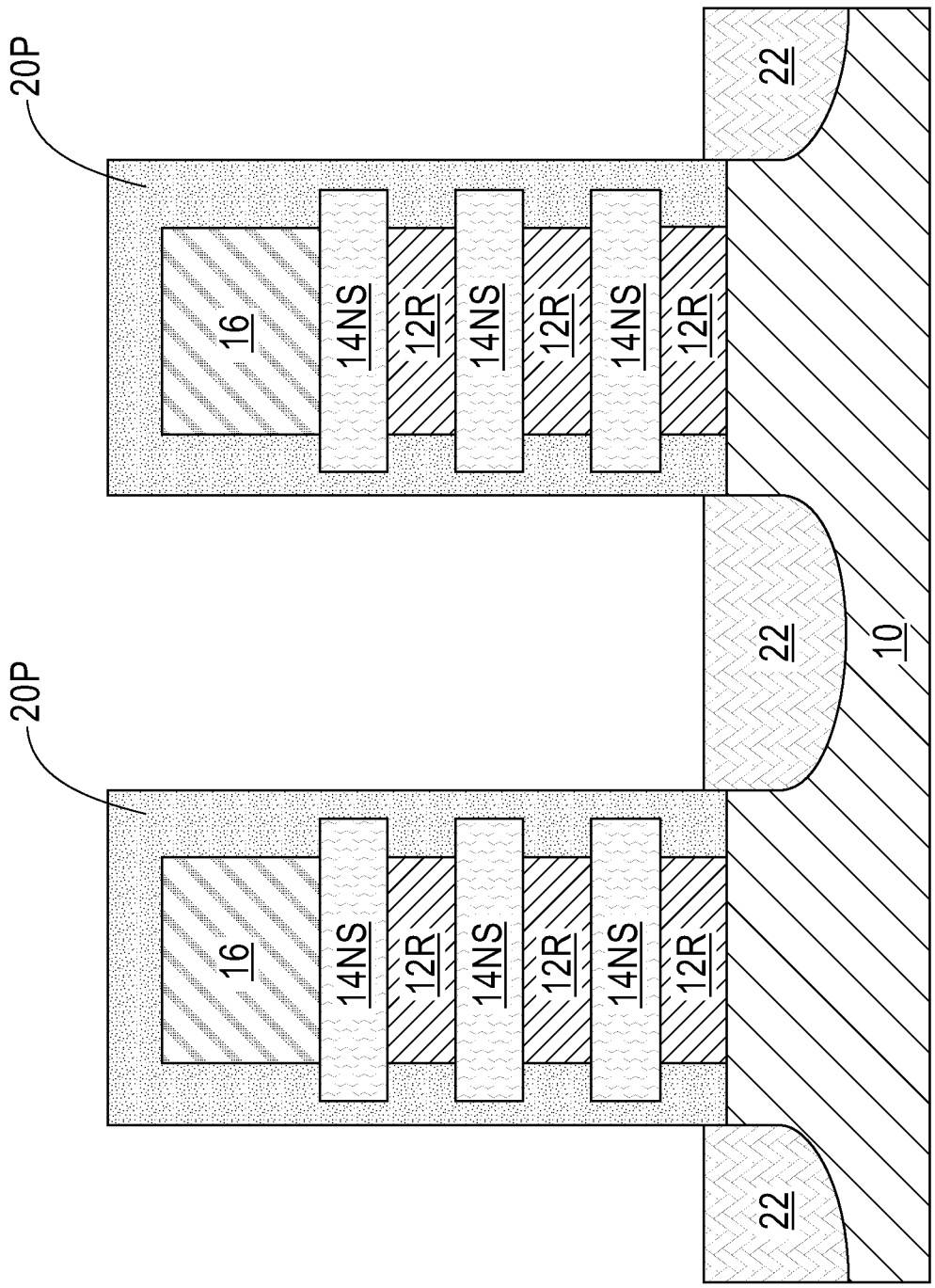
FIG. 7 is a cross sectional view of the exemplary semiconductor structure of FIG. 6 after epitaxial growth of a sacrificial germanium-containing semiconductor material layer on the physically exposed recessed surface of the semiconductor substrate.

Referring now to FIG. 7, there is illustrated the exemplary semiconductor structure of FIG. 6 after epitaxial growth of a sacrificial germanium-containing semiconductor material layer 22 on the physically exposed recessed surface of the semiconductor substrate 10. In some embodiments, the sacrificial germanium-containing semiconductor material layer 22 can be formed on the physically exposed recessed surface of the semiconductor substrate 10 of the exemplary semiconductor structure shown in FIG. 5. The sacrificial germanium-containing semiconductor material layer 22 has a different composition than the semiconductor substrate 10.

In one embodiment, the sacrificial germanium-containing semiconductor material layer 22 is composed of unalloyed (i.e., pure) germanium. In another embodiment, the sacrificial germanium-containing semiconductor material layer 22 can be composed of a silicon germanium alloy. In such an embodiment, the sacrificial germanium-containing semiconductor material layer 22 may include a germanium content of from 80 atomic percent to 99 atomic percent.

The sacrificial germanium-containing semiconductor material layer 22 can be formed utilizing a selective epitaxial growth process, i.e., the germanium-containing semiconductor material that provides the sacrificial germanium-containing semiconductor material layer 22 is grown only from physically exposed semiconductor surfaces (i.e., upward from the semiconductor substrate 10). The epitaxial growth of the sacrificial germanium-containing semiconductor material layer 22 may be performed in one of the apparatuses mentioned above for epitaxial growth. The temperature for epitaxial growth of the typically ranges from 550° C. to 900° C. The epitaxial growth of the can be performed utilizing any well known precursor gas or gas mixture. Carrier gases like hydrogen, nitrogen, helium and argon can be used.

The sacrificial germanium-containing semiconductor material layer 22 has a topmost surface that may or may not be coplanar with the topmost surface of the semiconductor substrate 10 that is present directly beneath the sacrificial gate structure 16. In one embodiment, the sacrificial germanium-containing semiconductor material layer 22 may extend from 10 nm to 30 nm below the topmost surface of the semiconductor substrate 10 and have a maximum height above the topmost surface of the semiconductor substrate 10 of 5 nm.

Figure 8:
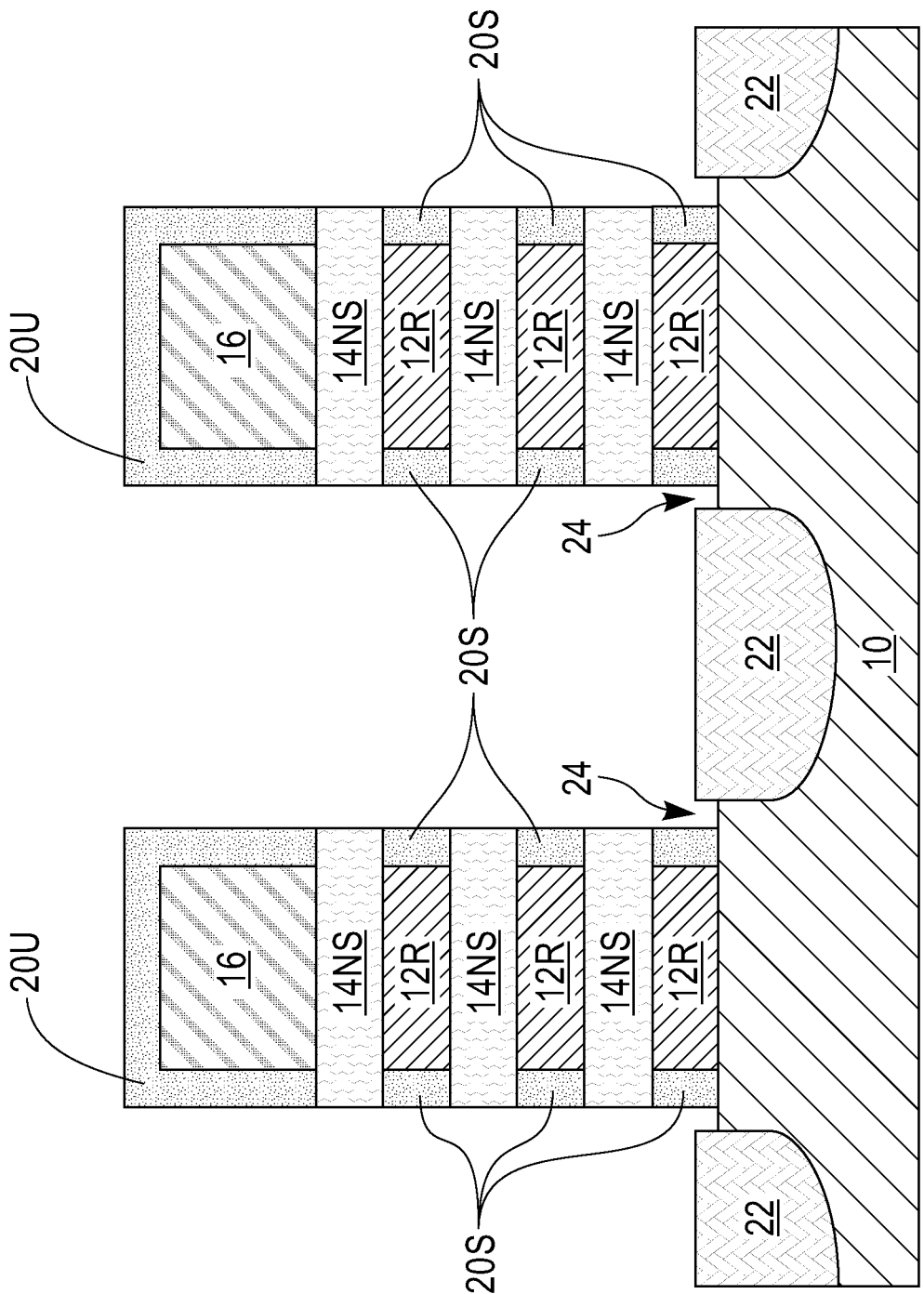
FIG. 8 is a cross sectional view of the exemplary semiconductor structure of FIG. 7 after forming inner gate spacers.

Referring now to FIG. 8, there is illustrated the exemplary semiconductor structure of FIG. 7 after forming inner gate spacers 20S. The inner gate spacers 20S are formed in the gaps created during the formation of each recessed sacrificial semiconductor material nanosheet 12R. The formation of the inner gate spacers 20S can be performed utilizing a material removal process such, as for example, etching. In one example, and when silicon nitride is employed as the dielectric gate spacer material portion 20P, hot phosphoric acid may be used as an etchant. It is noted that when hot phosphoric acid is employed as the etchant, an upper portion (from 10 Å to 15 Å) of the sacrificial germanium-containing semiconductor material layer 22 may also be removed.

The inner gate spacers 20S comprise a non-etched portion of the dielectric gate spacer material portion 20P that remains in each of the gaps. During this etch, an upper dielectric gate spacer material 20U is formed. The upper dielectric gate spacer material 20U represents a non-etched portion of the dielectric gate spacer material portion 20P that remains on the sacrificial gate structure 16. During inner spacer formation 20S, an opening 24 may form between the bottommost inner spacer 20S and the sacrificial germanium-containing semiconductor material layer 22. The opening 24 is undesirable and should be sealed prior to forming the source/drain regions otherwise a surface of the source/drain regions could form on the exposed surface of the semiconductor substrate 10 and such growth could lead to parasitic transistor formation.

Figure 9:
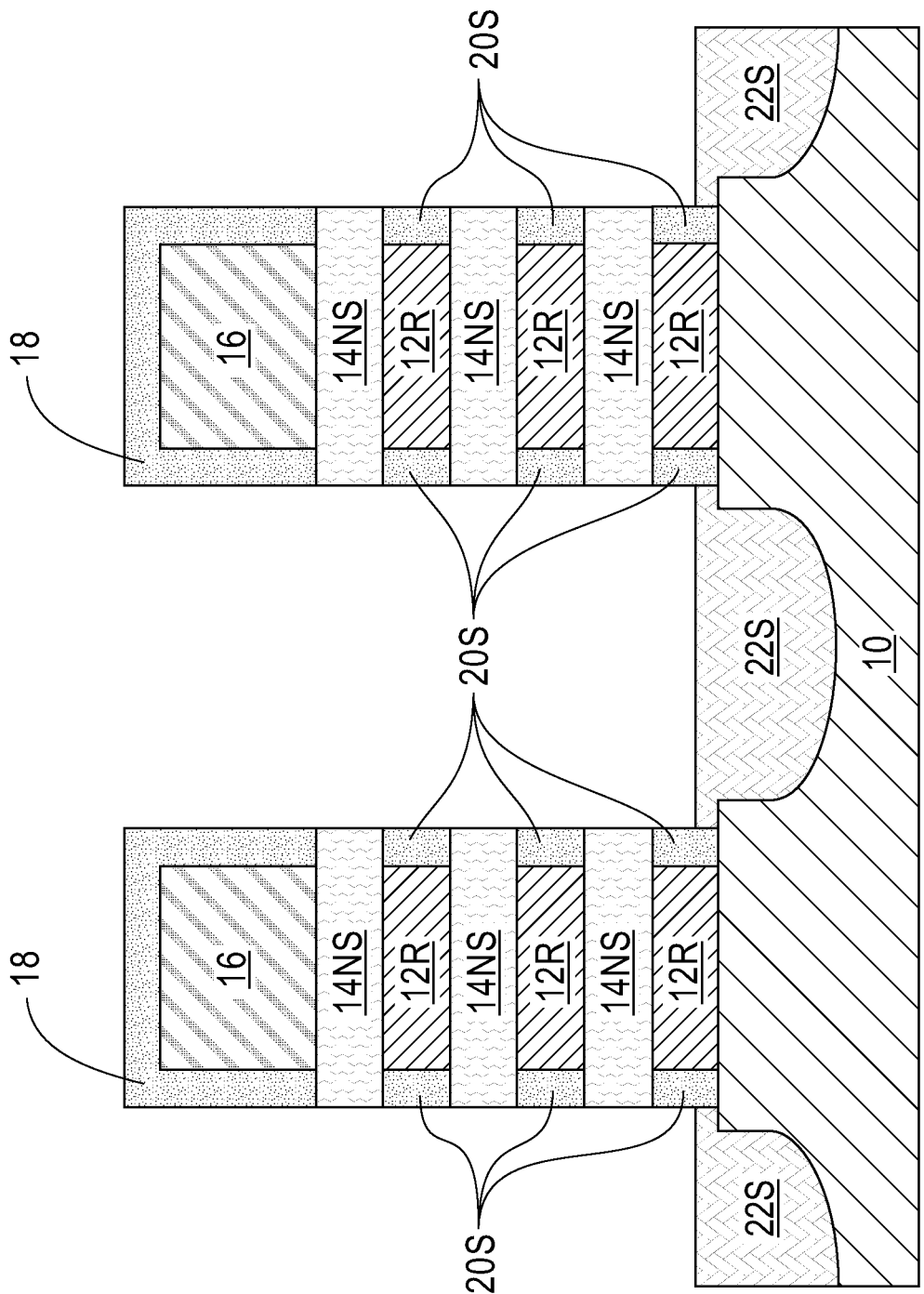
FIG. 9 is a cross sectional view of the exemplary semiconductor structure of FIG. 8 after reflowing the sacrificial germanium-containing semiconductor material layer to provide a sacrificial germanium-containing semiconductor material structure.

Referring now to FIG. 9, there is illustrated the exemplary semiconductor structure of FIG. 8 after reflowing the sacrificial germanium-containing semiconductor material layer 22. In some embodiments, this step may be omitted if no opening is formed. The reflown sacrificial germanium-containing semiconductor material layer 22 is referred to herein as a sacrificial germanium-containing semiconductor material structure 22S. The sacrificial germanium-containing semiconductor material structure 22S fills in the entirety of opening 26 that was formed during inner spacer 20S formation. As is shown, a sidewall surface of the sacrificial germanium-containing semiconductor material structure 22S is in direct physical contact with the bottommost inner spacer 20S. As is further shown, the sacrificial germanium-containing semiconductor material structure 22S has a topmost surface that is beneath a bottommost surface of the bottommost semiconductor material channel nanosheet 14NS of the nanosheet stack.

The reflowing of the sacrificial germanium-containing semiconductor material layer 22 is achieved by annealing. The annealing can be performed in a hydrogen-containing ambient such as, for example, $H_2$. The anneal is performed at a temperature that causes surface atom rearrangement and a reflow of the sacrificial germanium-containing semiconductor material layer 22. In one example, the anneal can be performed at a temperature from 350° C. to 700° C. The duration of the anneal may vary as long as the anneal is performed for a time that is sufficient to rearrange the surface atoms and reflow the sacrificial germanium-containing semiconductor material layer 22.

Figure 10A:
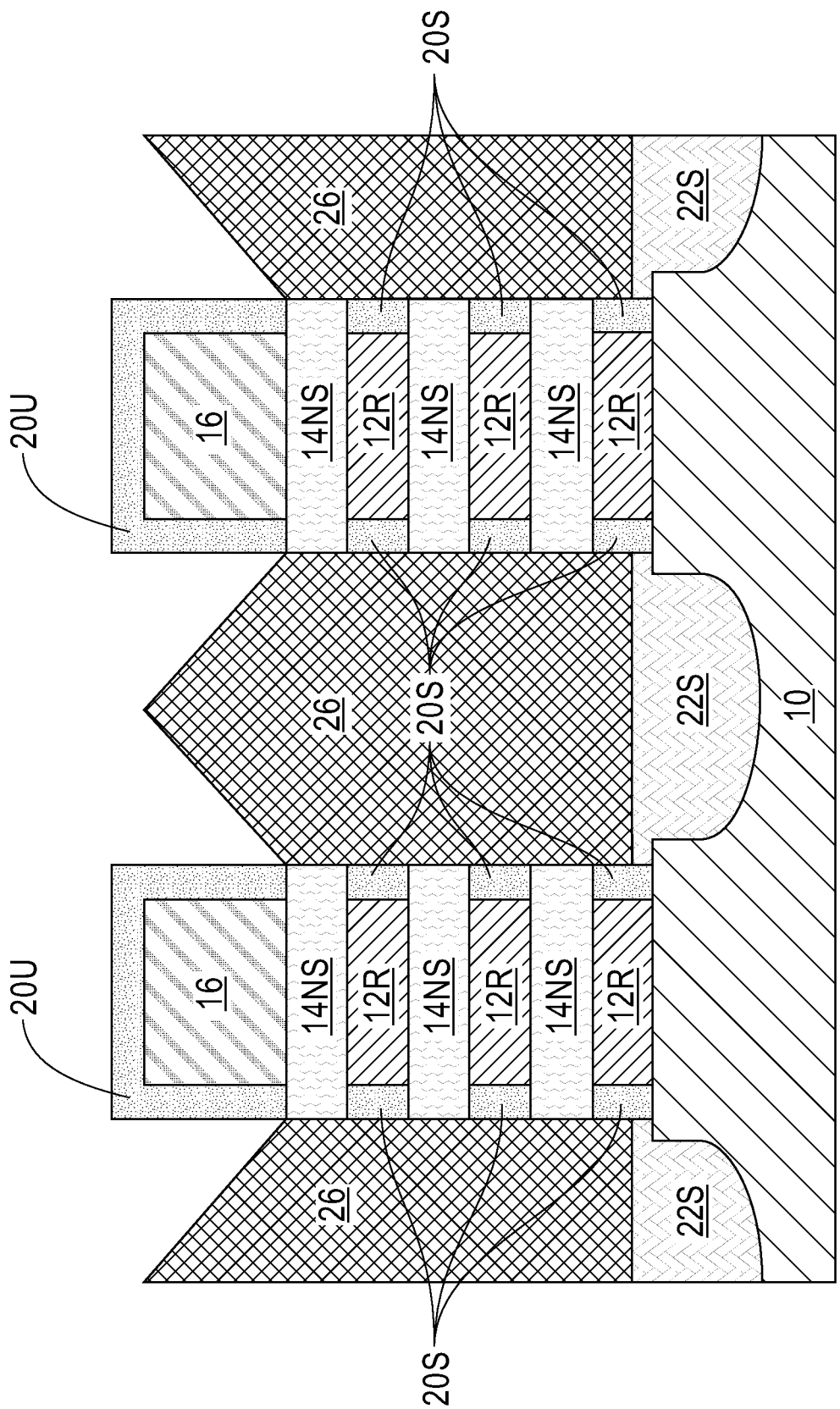
FIG. 10A is a cross sectional view of the exemplary semiconductor structure of FIG. 9 after forming source/drain (S/D) regions by epitaxial growth of a semiconductor material on physically exposed sidewalls of each semiconductor channel material nanosheet.
Figure 10B:
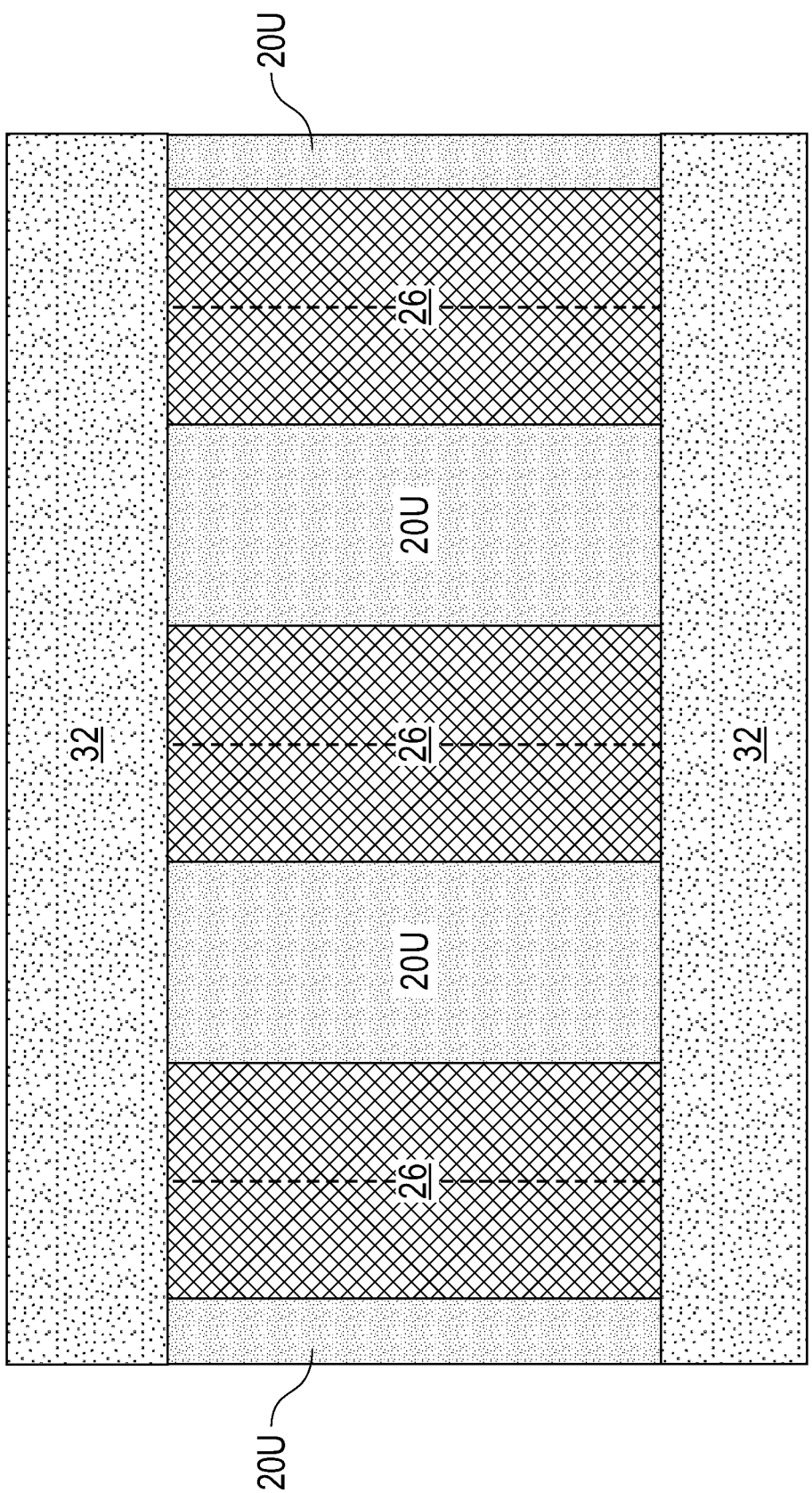
FIG. 10B is a top down view of the exemplary semiconductor structure of FIG. 10A.

Referring now to FIGS. 10A-10B, there are illustrated the exemplary semiconductor structure of FIG. 9 after forming source/drain (S/D) regions 26 by epitaxial growth of a semiconductor material on physically exposed sidewalls of each semiconductor channel material nanosheet 14NS. In the present application, the semiconductor material that provides the S/D regions 26 grows laterally out from the sidewalls of each semiconductor channel material nanosheet 14NS. The S/D regions 26 have a bottommost surface that directly contacts a topmost surface of the sacrificial germanium-containing semiconductor material structure 22S. In some embodiments, each S/D region 26 has a faceted upper surface. In FIG. 10B, element 32 denotes a trench isolation structure that is located around the active region of the semiconductor substrate 10 including the nanosheet stacks 15.

Each S/D region 26 includes a semiconductor material and a dopant. The semiconductor material that provides each S/D region 26 can be selected from one of the semiconductor materials mentioned above for the semiconductor substrate 10; the semiconductor material that provides each S/D region 26 is compositionally different from the sacrificial germanium-containing semiconductor material structure 22S. In some embodiments of the present application, the semiconductor material that provides each S/D region 26 may comprise a same semiconductor material as that which provides each semiconductor channel material nanosheet 14NS. In other embodiments of the present application, the semiconductor material that provides each S/D region 26 may comprise a different semiconductor material than that which provides each semiconductor channel material nanosheet 14NS. For example, the semiconductor material that provides each S/D region 26 may be composed of silicon germanium alloy, while each semiconductor channel material nanosheet 14NS may be composed of silicon.

The dopant that is present in each S/D region 26 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the doped semiconductor material provides each S/D region 26 comprises silicon or a silicon germanium alloy that has a dopant concentration of from $4 \times 10^{20}$ atoms/cm$^3$ to $3 \times 10^{21}$ atoms/cm$^3$.

In one embodiment, the dopant that can be present in the each S/D region 26 can be introduced into the precursor gas that provides each S/D region 26. In another embodiment, the dopant can be introduced into an intrinsic semiconductor layer by utilizing one of ion implantation or gas phase doping. In one example, each S/D region 26 comprises a silicon germanium alloy that is doped with a p-type dopant such as, for example, boron. As mentioned above, each S/D region 26 is formed by an epitaxial growth (or deposition) process, as is defined above.

Figure 11:
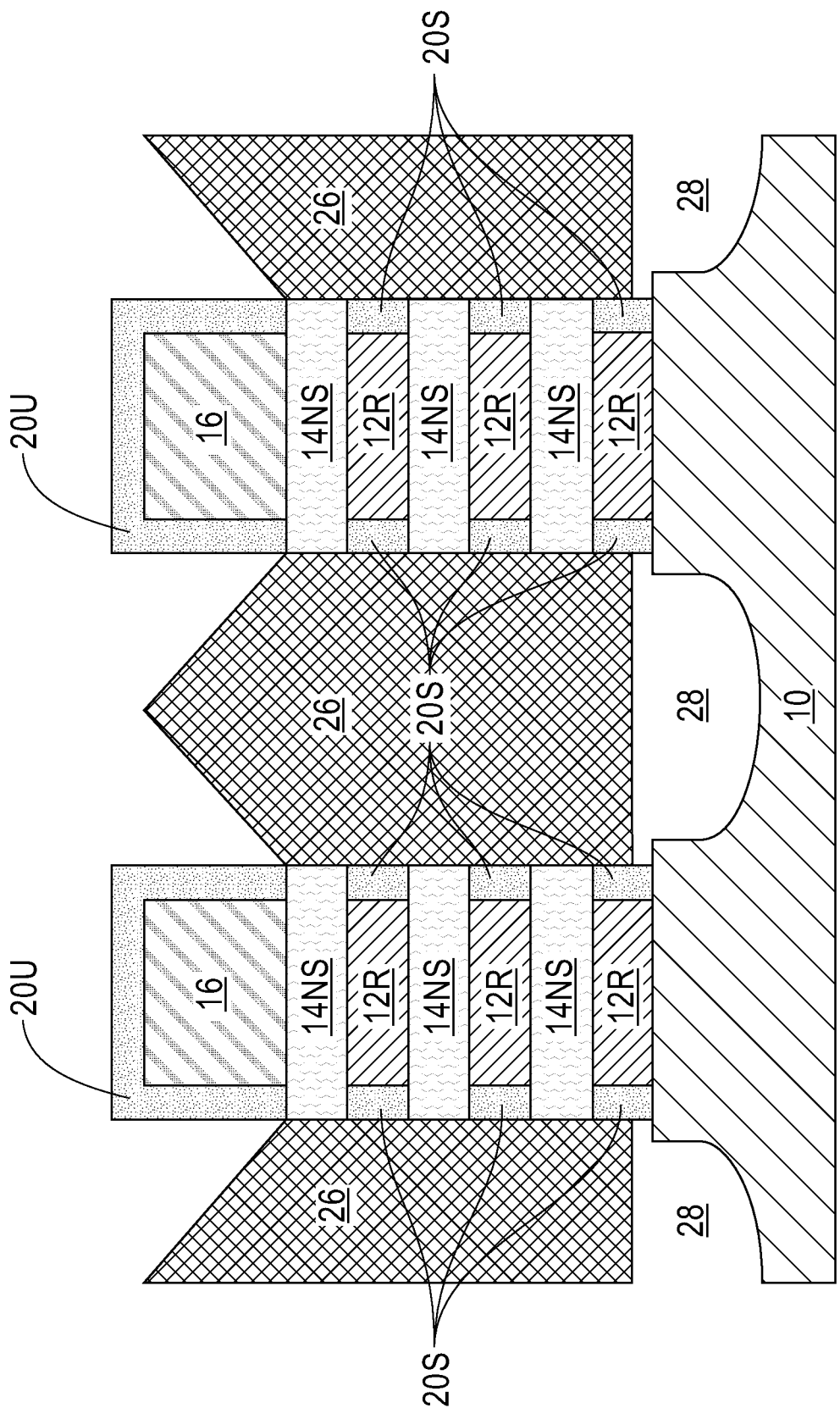
FIG. 11 is a cross sectional view of the exemplary structure of FIG. 10 after removing the sacrificial germanium-containing material structure from the structure.

Referring now to FIG. 11, there is illustrated the exemplary structure of FIGS. 10A-10B after removing the sacrificial germanium-containing semiconductor material structure 22S from the structure. The removal of the sacrificial germanium-containing semiconductor material structure 22S provides an airgap 28 beneath the S/D regions 26 and the semiconductor substrate 10. The airgap 28 may contact sidewalls of the bottommost inner spacer 20S. The removal of the sacrificial germanium-containing semiconductor material structure 22S may be performed utilizing an etchant that is selective in removing the sacrificial germanium-containing semiconductor material structure 22S. In one example, and when the sacrificial germanium-containing semiconductor material structure 22S is composed of unalloyed germanium, a diluted water based hydrogen peroxide solution may be used to remove the sacrificial germanium-containing semiconductor material structure 22S.

Figure 12A:
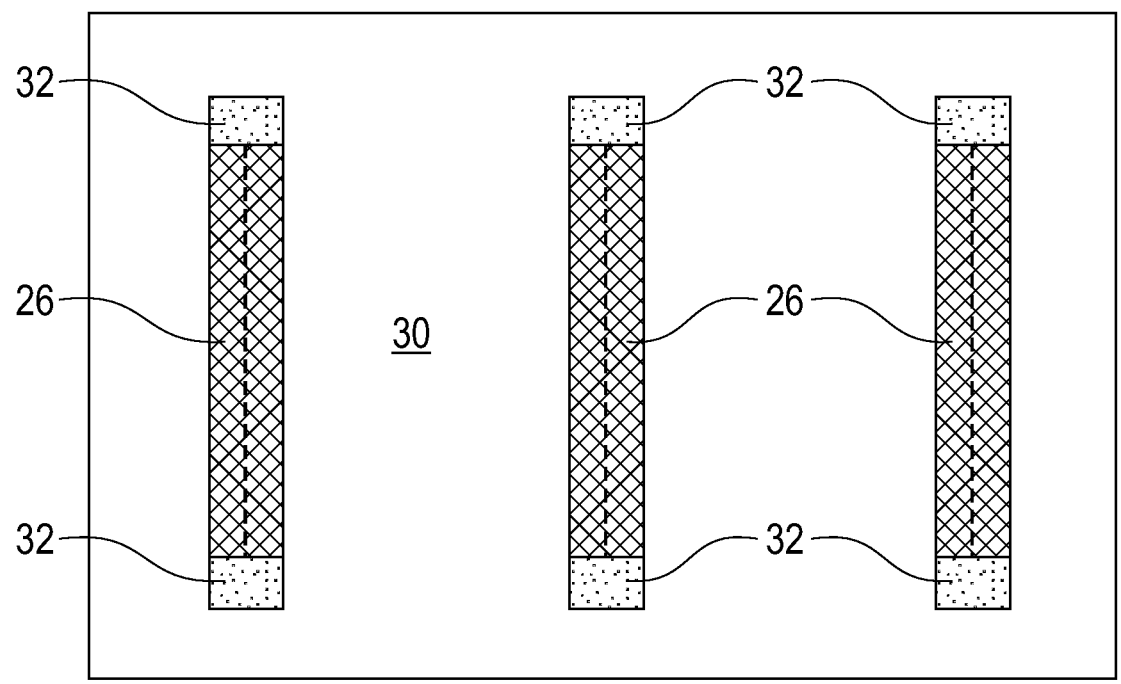
FIGS. 12A and 12B are drawings showing the various processing steps used in providing the exemplary semiconductor structure of FIG. 11.
Figure 12B:
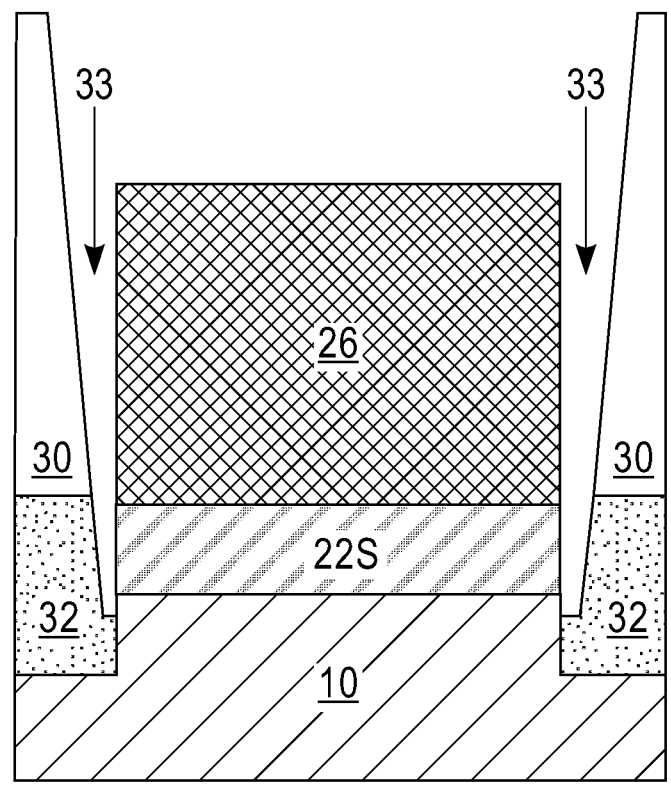

The process of removing the sacrificial germanium-containing semiconductor material structure 22S (or the sacrificial germanium-containing semiconductor material in general) is shown in FIGS. 12A and 12B. The process begins by first forming interlevel dielectric (ILD) material layer 30 surrounding each functional gate structure 16 and each nanosheet stack. The ILD material layer 30 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 30. The use of a self-planarizing dielectric material as the ILD material layer 30 may avoid the need to perform a subsequent planarizing step.

In one embodiment, the ILD material layer 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 30, a planarization process or an etch back process follows the deposition of the dielectric material that provides the ILD material layer 30.

Next, trenches 33 are formed into the ILD material layer 30 that extend into the trench isolation structure 32 that surrounds the active region/area of the semiconductor substrate 10 containing the nanosheet stacks 15. The trenches 33 can be formed by lithography and etching. In one example, a selective reactive ion etch is used to provide the trenches 33 that extend into the trench isolation structure 32, but does not remove the source/drain regions 26; at this point of the present application the S/D regions 26 are also exposed by the trenches. Also and as is shown in FIG. 12B, this etch laterally exposes the sacrificial germanium-containing semiconductor material structure 22S. The exposed sacrificial germanium-containing semiconductor material structure 22S can then be removed utilizing the etchant described above providing the airgap 28 shown in FIG. 11.

Figure 13:
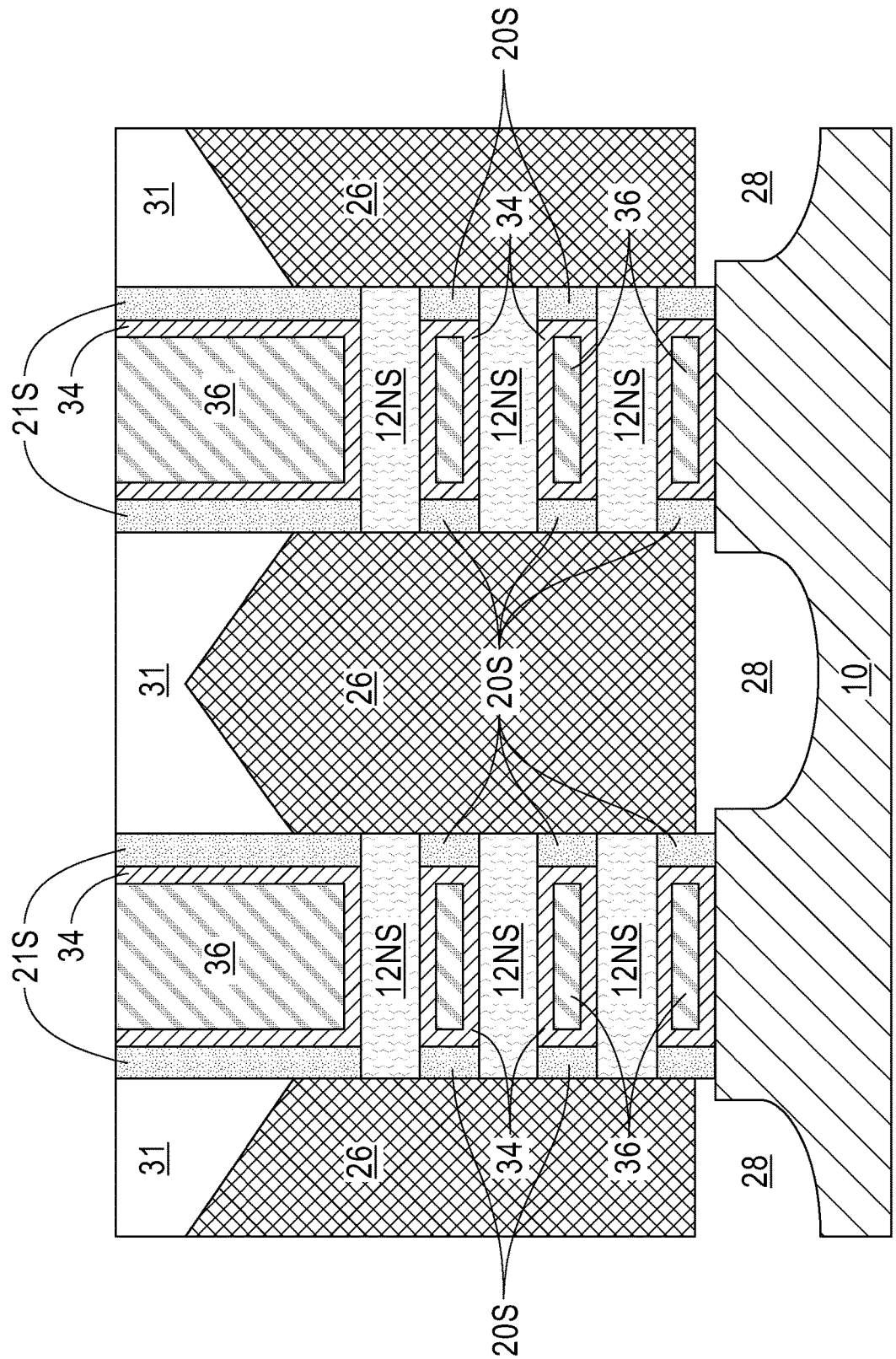
FIG. 13 is a cross sectional view of the exemplary structure of FIG. 11 after formation of additional interlevel dielectric (ILD) material, removing each sacrificial gate structure and each recessed sacrificial semiconductor material nanosheet, and forming a functional gate structure around a physically exposed surface of each semiconductor channel material nanosheet.

Referring now to FIG. 13, there is illustrated the exemplary structure of FIG. 11 after formation of additional interlevel dielectric (ILD) material 31, removing each sacrificial gate structure 16 and each recessed sacrificial semiconductor material nanosheet 12R, and forming a functional gate structure (34, 36) around a physically exposed surface of each semiconductor channel material nanosheet 14NS. The additional ILD material 31 includes one of the ILD materials mentioned above for ILD material layer 30. In one embodiment, the additional ILD material 31 is composed of a same ILD material as ILD material layer 30. In another embodiment, the additional ILD material 31 may be composed of a different ILD material than ILD material layer 30. The additional ILD material 31 may be formed utilizing one of the techniques mentioned above for forming the ILD material layer 30. The LID material layer 30 may partially fill and pinch-off at the ends of the area in which airgap 28 is formed.

After providing the additional material 31, a horizontal portion of upper dielectric gate spacer material 20U is removed from atop each sacrificial gate structure 16 to provide topmost inner gate spacers 21S, and thereafter each sacrificial gate structure 16 is removed to provide a gate cavity (not specifically shown). The removal of the horizontal portion of the upper dielectric gate spacer material 20U that is above each sacrificial gate structure 16 and the sacrificial gate structure 16 can be performed utilizing one or more anisotropic etching processes.

Next, each semiconductor channel material nanosheet 14NS is suspended by selectively etching each recessed sacrificial semiconductor material nanosheet 12R relative to each semiconductor channel material nanosheet 14NS. A functional gate structure (34, 36) is then formed in each gate cavity and surrounding a physically exposed surface of each semiconductor channel material nanosheet 14NS. By "functional gate structure" it is meant a permanent gate structure used to control output current (i.e., flow of carriers in the channel) of a semiconducting device through electrical or magnetic fields.

The functional gate structure (34, 36) may include a gate dielectric portion 34 and a gate conductor portion 36. The gate dielectric portion 34 may include a gate dielectric material. The gate dielectric material that provides the gate dielectric portion 34 can be an oxide, nitride, and/or oxynitride. In one example, the gate dielectric material that provides the gate dielectric portion 34 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 34.

The gate dielectric material used in providing the gate dielectric portion 34 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 34 can have a thickness in a range from 1 nm to 10 nm. Other thicknesses that are lesser than, or greater than, the aforementioned thickness range can also be employed for the gate dielectric material that may provide the gate dielectric portion 34.

The gate conductor portion 36 can include a gate conductor material. The gate conductor material used in providing the gate conductor portion 36 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 36 may comprise an nFET gate metal. In another embodiment, the gate conductor portion 36 may comprise a pFET gate metal. When multiple gate cavities are formed, it is possible to form a nFET in a first set of the gate cavities and wrapping around some of the semiconductor channel material nanosheet 14NS and a pFET in a second set of the gate cavities and wrapping around some of the semiconductor channel material nanosheet 14NS.

The gate conductor material used in providing the gate conductor portion 36 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 36 can have a thickness from 50 nm to 200 nm. Other thicknesses that are lesser than, or greater than, the aforementioned thickness range can also be employed for the gate conductor material used in providing the gate conductor portion 36.

The functional gate structure (34, 36) can be formed by providing a functional gate material stack of the gate dielectric material, and the gate conductor material. A planarization process may follow the formation of the functional gate material stack. It is noted that after formation of the functional gate structure (34, 36), the functional gate structure (34, 36) has a topmost surface that is coplanar with a topmost surface of the ILD material 31.

Notably, FIG. 13 illustrates an exemplary semiconductor structure in accordance with an embodiment of the present application in which parasitic transistor formation under each semiconductor containing nanosheet device is eliminated. As is illustrated in FIG. 13, the exemplary semiconductor structure includes the semiconductor structure includes a plurality of stacked and suspended semiconductor channel material nanosheets 14NS located above a semiconductor substrate 10. A functional gate structure (34, 36) surrounds a portion of each semiconductor channel material nanosheet 14NS of the plurality of stacked and suspended semiconductor channel material nanosheets. A source/drain (S/D) region 26 is present on each side of the functional gate structure (34, 36) and physically contacts sidewalls of each semiconductor channel material nanosheet 14NS of the plurality of stacked and suspended semiconductor channel material nanosheets. An airgap 28 is located between the source/drain (S/D) region 26 and the semiconductor substrate 10. The semiconductor structure of FIG. 13 has improved electrostatic properties and no parasitic transistor formation.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of stacked and suspended semiconductor channel material nanosheets located above a horizontal planar surface of a semiconductor substrate;
a functional gate structure surrounding a portion of each semiconductor channel material nanosheet of the plurality of stacked and suspended semiconductor channel material nanosheets;
a source/drain (S/D) region on each side of the functional gate structure and physically contacting sidewalls of each semiconductor channel material nanosheet of the plurality of stacked and suspended semiconductor channel material nanosheets; and
an airgap located between the source/drain (S/D) region and a recessed surface of the semiconductor substrate, wherein the airgap entirely separates the source/drain (S/D) region from the recessed surface of the semiconductor substrate, and the airgap has a first surface that directly contacts a portion of the horizontal planar surface of the semiconductor substrate.

2. The semiconductor structure of claim 1, further comprising an inner gate spacer contacting a sidewall of the functional gate structure and located on an outer portion of each semiconductor channel material nanosheet of the plurality of stacked and suspended semiconductor channel material nanosheets.

3. The semiconductor structure of claim 1, wherein each source/drain (S/D) region has a faceted upper surface.

4. The semiconductor structure of claim 1, further comprising an interlevel dielectric (ILD) material located above each S/D region.

5. The semiconductor structure of claim 4, wherein the ILD material atop each S/D region has a topmost surface that is coplanar with a topmost surface of the functional gate structure.

6. The semiconductor structure of claim 1, wherein sidewalls of each semiconductor channel material nanosheet of the plurality of stacked and suspended semiconductor channel material nanosheets are vertically aligned to each other.

7. The semiconductor structure of claim 1, wherein the airgap has a second surface that directly contacts the recessed surface of the semiconductor substrate.

8. The semiconductor structure of claim 1, wherein the recessed surface of the semiconductor substrate is a concave surface.

9. The semiconductor structure of claim 2, wherein the airgap contacts a sidewall of a bottommost inner spacer.

10. The semiconductor structure of claim 1, wherein the airgap has a topmost surface that does not extend beyond a bottommost surface of a bottommost semiconductor channel material nanosheet of the plurality of stacked and suspended semiconductor channel material nanosheets.

11. The semiconductor structure of claim 1, wherein no parasitic transistor is present beneath the plurality of stacked and suspended semiconductor channel material nanosheets.

* * * * *